United States Patent [19]

Anger et al.

[11] 4,246,487
[45] Jan. 20, 1981

[54] METHOD AND DEVICE FOR DETERMINING THE FOCAL LENGTH OF A LONG FOCAL LENGTH ELECTRON OPTICAL LENS

[75] Inventors: Klaus Anger; Jürgen Frosien; Burkhard Lischke, all of Berlin, Fed. Rep. of Germany

[73] Assignee: Siemens Aktiengesellschaft, Berlin and Munich, Fed. Rep. of Germany

[21] Appl. No.: 48,627

[22] Filed: Jun. 14, 1979

[30] Foreign Application Priority Data

Jun. 16, 1978 [DE] Fed. Rep. of Germany ....... 2827085

[51] Int. Cl.³ ............................................ A61K 27/02
[52] U.S. Cl. ............................... 250/492 R; 250/311; 250/396 R
[58] Field of Search .................. 250/311, 492 R, 396, 250/397, 396 R

[56] References Cited

U.S. PATENT DOCUMENTS 3,795,813  3/1974  Kunath .................................. 250/396

*Primary Examiner*—Harold A. Dixon
*Attorney, Agent, or Firm*—Hill, Van Santen, Steadman, Chiara & Simpson

[57] ABSTRACT

A method and a device used for determining the focal length of a long focal length electron optical lens particularly used with a microprojector characterized by projecting a bundle of parallel rays along the axis of the long focal length lens, said bundle of rays having a ring-shaped cross section with a radius R, providing a pinhole diaphragm having a diameter which corresponds approximately to the diameter of the circle of least confusion of the lens for a ring-shaped bundle of parallel rays, either positioning the diaphragm axially relative to the lens or holding the diaphragm fixed and changing the excitement of the lens to obtain the least influence of the diaphragm on the bundle of rays passing through the pinhole diaphragm, detecting the image of the rays passing through the diaphragm on a plane at a distance $z_2$ from the diaphragm, measuring the radius r of the image of the ring-shaped bundle of rays on the plane and then determining the focal length f from the magnitude of R, r, $z_2$ according to the formula $f=(R/r)\cdot z_2$. The device includes an annular field stop for producing the bundle of rays having a ring-shaped cross section, means for positioning the field stop in that path of the rays prior to their reaching the lens, a diaphragm having an aperture of the circle of least confusion for the lenses of the ring-shaped bundle of parallel rays and means for recording the image passing through the diaphragm.

10 Claims, 4 Drawing Figures

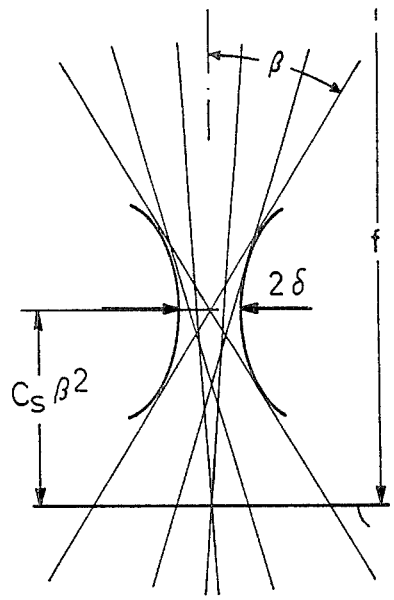
FIG.1
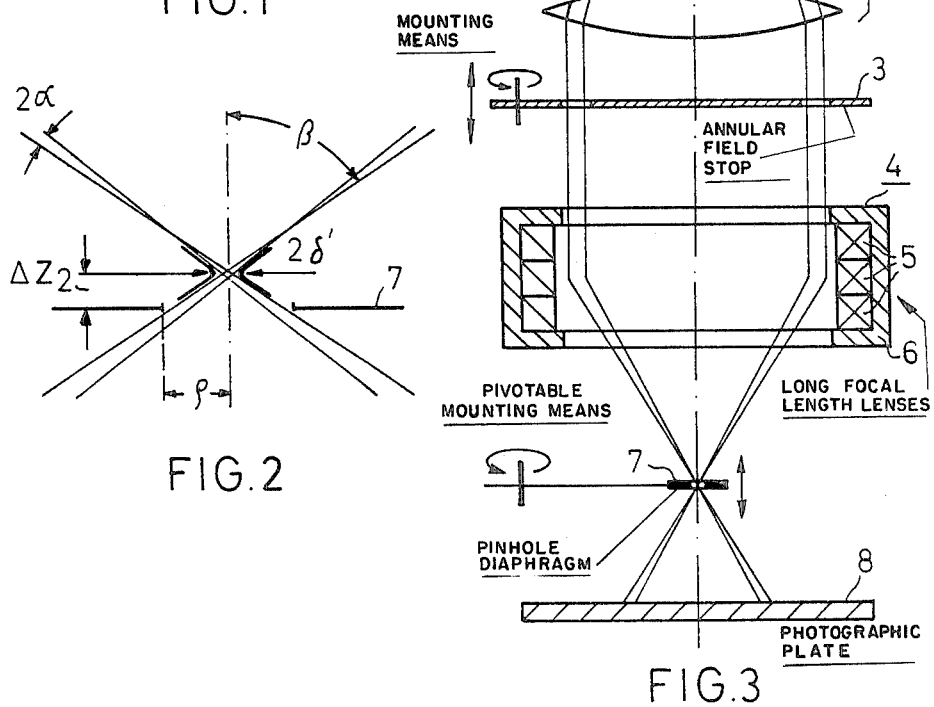
FIG.2
FIG.3

METHOD AND DEVICE FOR DETERMINING THE FOCAL LENGTH OF A LONG FOCAL LENGTH ELECTRON OPTICAL LENS

BACKGROUND OF THE INVENTION

The present invention is directed to a method and device for determining the focal length of long focal length electron optical lenses especially electron optical lenses utilized in a microprojector.

In the manufacture of highly integrated switching circuits, a microprojector is utilized so that an image of a large area transmission mask can be projected on a photosensitive surface layer on a wafer, for example a monocrystalline silicon wafer as a desired reduced image and after processing to form a desired structure, additional images are projected on additional photosensitive layer to produce subsequent structural features. With progressive miniaturization, the demands on the imaging system increase. If the structures with a position accuracy of 0.1 μm are to be produced on an image field of 5 mm, the allowable error in alignment relative to the image field diameter amounts for approximately $2 \times 10^{-5}$. In order to be able to obtain this accuracy even in the case of repeated exposures and for a setting of the microprojector, the focal length of the lenses used for the paths of rays and especially for an enlargement must be known very precisely.

In the case of a conventional electron optical instrument, for example an electron microscope, the focal length can be determined through magnification measurements with a known test object. Due to the high possible magnification values and the lower accuracy requirement which is present in an electron microscope but not in a microprojector, this method is sufficient for conventional electron optical instruments. In the case of microprojectors, on the other hand, the image of a transmission mask is reduced only approximately by a factor of 1:10 onto the layer of the wafer. The known method for focal length measurement therefore does not provide the required accuracy.

SUMMARY OF THE INVENTION

The present invention is directed to provide a method and device for determining the focal lengths and principal planes of the long focal length electron optical lenses with a high degree of accuracy. These tasks are accomplished by utilizing a method which comprises the step of projecting a bundle of parallel rays on the long focal length lenses, said bundle of parallel rays having a ring-shaped cross section with a radius R; providing a pinhole diaphragm having a diameter which corresponds approximately to the diameter of the circle of least confusion of the lenses for the ring-shaped bundle of parallel rays in an approximate position of the focal plane; changing the axial distance of the diaphragm relative to the focal point of the lens to obtain the least influence by the diaphragm on the bundle of rays passing therethrough; detecting the image of the rays passing through the diaphragm on a plane at a distance $z_2$ from the diaphragm; measuring the radius r of the image of the ring-shaped bundle of rays on the plane and then determining the focal length f from the magnitude of R, r, $z_2$ according to a formula $f = (R/r) \cdot z_2$.

The attainable accuracy for the determination of the focal length thus depends upon the accuracy with which R, r and $z_2$ can be determined. The radius R can be measured quite accurately so that the error appearing there opposed to the errors in determining the distance $z_2$ and radius r can be disregarded. The accuracy of the procedure for determining the focal length thus depends essentially upon the accuracy with which the location of the posterior focal plane and the radius r of the ring-shaped bundle of rays can be determined. For the relative error and the focal length determination one can thus write $$\frac{\Delta f}{f} = \frac{\Delta z_2}{z_2} + \frac{\Delta r}{r}.$$

By the use of the bundle of rays with the ring-shaped cross section according to the present invention, the location of focal planes can be determined very easily as the following considerations will elucidate.

The method is carried out by utilizing the device for determining the focal length of long focal length lenses of a microprojector which has an electron ray source positioned at the focal point for a condenser lens system, said condenser lens providing a bundle of parallel rays for the long length focal lenses so that the rays from the source pass through the condenser lens then through the long focal lens for projection on a surface of an object. The device for determining comprises providing an annular field stop, first means for pivotably mounting the annular field stop between the condenser lens system and the long focal length lenses, said means enabling pivoting the field stop from a first position in the path of the rays from the condenser lens to a second position removed from the path so that a ring-shaped bundle of parallel rays are received by the long focal length lenses. The device also includes providing a pinhole diaphragm having an aperture with the aperture corresponding to approximate diameter of the circle of least confusion of the long focal length lenses for a ring-shaped bundle of rays having a radius R, a second means for pivotably mounting the pinhole diaphragm for pivotable movement into and out of the path of rays from the long focal length and recording means for recording the intensity of the bundle of rays passing through the pinhole diaphragm. The recording means can be either a photographic plate or may be a ring-shaped detector with the radius r which is mounted by means for mounting the ring-shaped detector for displacement along the optical axis of the long focal length lenses. In addition, the second means for pivotably mounting the pinhole diaphragm preferably includes means for displacing of the diaphragm along the optical axis of the long focal length lenses to a position of least influence on the passing rays. However, the change in the distance between the diaphragm and focal point of the lens can be accomplished by holding the diaphragm fixed and varying the excitement of the lens to change the position of the focal point.

BRIEF DESCRIPTION OF THE DRAWINGS

FIG. 1 is a schematic presentation illustrating the aperture aberration for a bundle of parallel rays passing through a lens system;

FIG. 2 is a schematic presentation illustrating the aperture aberration for a ring-shaped bundle of rays focused by a lens system;

FIG. 3 is a schematic construction with portions in cross sections for purposes of illustration of a microprojector provided with the device of the present invention.

DESCRIPTION OF THE PREFERRED EMBODIMENTS

Figure 4:
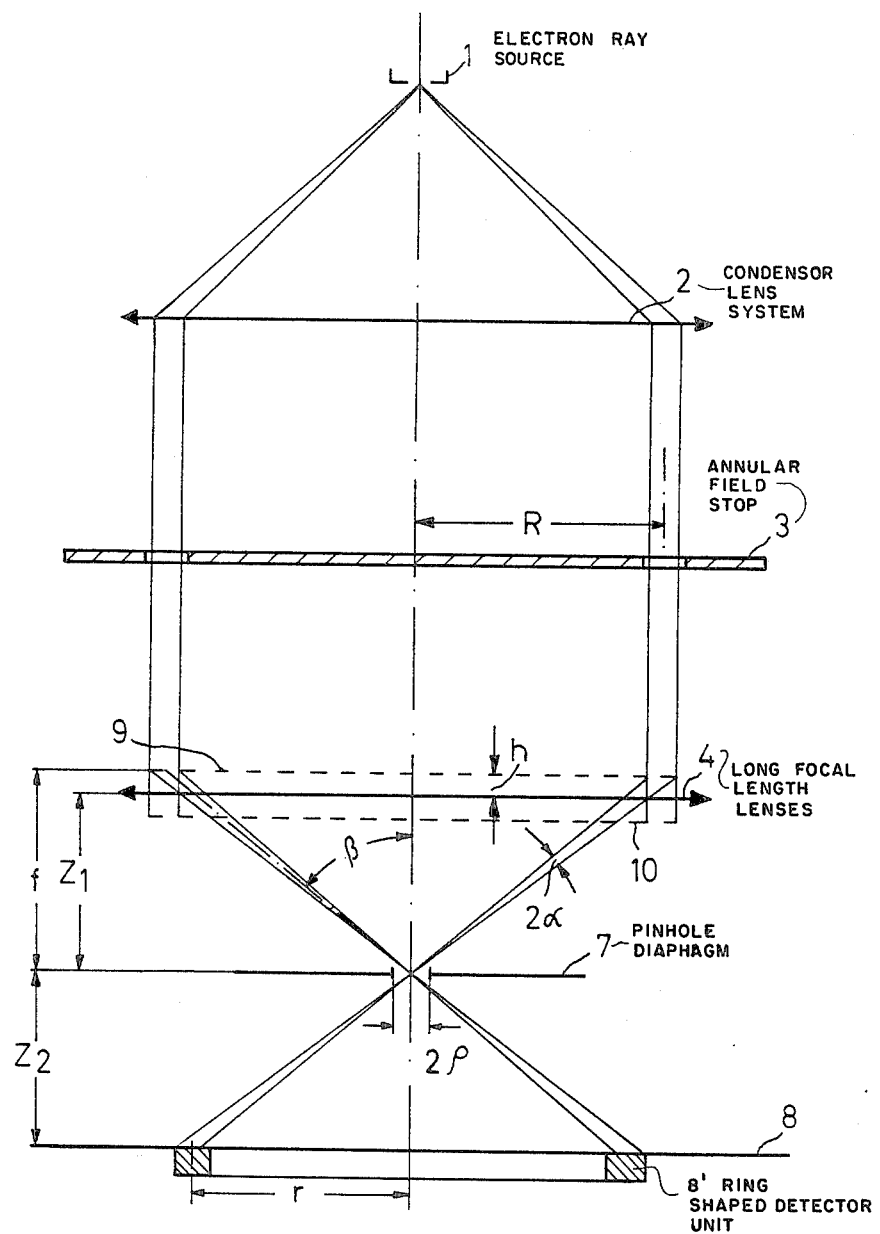
FIG. 4 is an illustration of a path of rays in the course of determining the focal length of the lens system in accordance with the present invention.

The principles of the present invention are particularly useful when incorporated in a microprojector for determining the focal plane for a lens such as 4 in FIG. 3.

The principle paths of rays of a bundle directed at a lens with the rays being parallel to the axis of the lens and the distance of the rays from the axis being from zero up to a maximum distance is illustrated in FIG. 1. Because of aperture aberration or spherical aberration $C_s$ of the lens, rays, which are received by the lens at different axial distances, will intersect the axis at different places after leaving the lens. The focal plane is thus defined as the plane in which the rays which proceed with a randomly small angle relative to the optical axis intersect the axis (paraxial rays). The aperture aberration $C_s$ of the lens has this effect. Rays with an angle $\beta$ to the axis of the lens will intersect the axis at a distance $C_s \cdot \beta^2$ in front of the focal plane as illustrated.

The smallest diameter of an envelope determines the plane of the circle of least or smallest confusion and is designated with $2\delta$, which is the magnitude of an aperture circle of least confusion. As one can deduce from FIG. 1, the diameter of the envelope, over a large axial range, changes a very small amount. Since the displacement of a pinhole diaphragm along the optical axis over a large range of displacements would have no influence upon the transmitted intensity of the bundle of rays, one, who attempts to determine the focal surface or plane of a lens by utilizing the pinhole diaphragm with the bundle of rays, as illustrated in FIG. 1, would have great inaccuracies in the determination of the position of the focal plane.

For the use of a bundle of rays having a ring-shaped cross section in accordance with the present invention, the focal length can be determined much more accurately. In FIG. 2, the corresponding paths of rays are represented. Because of the large radius R of the bundle of rays striking upon the lens, angle $\beta$ between the axis and the refracted ray of the lens is large. Since the angle $2\alpha$ between the extreme rays of the bundle of rays is very small in relation to the angle $\beta$, an envelope with a strong waist results and, therefore, a small diameter $2\delta'$ of the circle of least confusion results.

The focal length determined from this deviates from the lens focal length defined by paraxial rays by the magnitude $C_s \beta^2$. If this magnitude is to be included with the measured focal length, then the aperture aberration $C_s$ must be known. However, since this correction is negligible in the case of optical dimensioning of the annular field, when $C_s \beta^2 << f$, then $C_s$ needs only to be known approximately in order to still achieve a high accuracy for determining the focal length. The value of $C_s$ can be calculated from the lens data.

If one assumes that the image of the electron ray source is punctiform or a point source and that the pinhole diaphragm 7 has an aperture or pinhole with a diameter of $2\rho$, then one obtains an uncertainty of the path distance $z_2$ of $$\Delta z_2 = \frac{1}{\beta} \cdot \rho.$$

In order to make the uncertainty $\Delta z_2$ small, an angle $\beta$ must be large and the diameter of the pinhole of the diaphragm 7 must be small. The latter must, however, be at least as large as the diameter of the circle of least confusion in order to transmit the total intensity of the bundle of rays through the pinhole of the diaphragm 7. On the other hand, with $\beta$ the circle of least confusion in the stop plane, as illustrated in FIG. 2, also increases according to the formula $2\delta' = 2C_s\beta^2\alpha$ so that the required pinhole diameter $2\rho$ also increases. When the value of $C_s$ or $\beta$ or $\alpha$ is smaller, the smaller $2\rho$ can also be and the $z_2$ determination can be all the more accurate.

The opposing demands on $\beta$ suggest that there is an optimum angle $\beta$ for an optimum ring diameter $2R$. These result from the conditions that the measuring error for the ray diameter $2r$ behind a pinhole diaphragm ought to be approximately equal to the measuring error in determining the location of the focal plane according to a formula of $$R_{opt} \approx f\sqrt{\frac{\Delta r}{6C_2\alpha}}.$$

The location of the principle planes assigned to the focal length result from the difference between the measured lens focal length and the distance between the pinhole diaphragm and the mechanical lens center. The measurement accuracy depends alone upon the precision with which the focal length can be determined.

Further, the invention is based upon a problem of providing a device with which in the case of a microprojector, the determination of the focal length can be carried out repeatedly. This further problem is solved according to the invention by the condenser lens system lying in the ray direction in front of the long focal length lens. An electron source is located in the front focal plane of the condenser lens system, and an annular field stop, which has an annular or ring-shaped window, is mounted by pivotable means so that it may be pivoted to a first position in the path of rays projected by the condenser lens system toward the long focal length lenses. The device also includes a pinhole diaphragm which is also pivotably mounted for movement into the path of rays in the ray direction behind the long focal length lenses and a recording unit for the bundle of rays passing through the pinhole of the diaphragm.

An axis parallel bundle of rays from the condenser lens can be masked out by the annular field stop to produce a bundle of parallel rays having an annular, ring-shaped cross section. With the pinhole diaphragm, the back focal surface can be determined advantageously when the diaphragm is displaced back and forth along the axis until an optimum illumination results in the recording plane. It is also possible to change the excitement of the lens until the focal plane coincides with the plane of the stationary pinhole diaphragm.

With respect to the construction development of the device, it is advisable that a photographic plate be provided as the recording unit on the recording plane. After development of the plate, the radius r can be measured very accurately. An advantageous development of the device is if the recording unit is a ring-shaped detector, which is displaceable along the optical axis of the device. This detector has a solid, fixed specified radius r. Thus, the plane will be determined when the bundle of rays also possesses the radius r.

In FIG. 3, a microprojector having an electron source 1, a three-stepped or stage condenser lens system 2, a long focal length magnetic lens 4 is illustrated. The source 1 is provided at the rear focal point of the condenser lens system 2, which lens system provides a bundle of rays which are essentially parallel to the axis of the system, which axis is illustrated in chain lines. The rays from the condenser lens system 2 are directed at the long focal length lens 4. As illustrated, an annular field stop 3 having an annular or ring-shaped ray transmission window is mounted by means to enable pivoting or rotation from the first position illustrated in the path of the parallel bundle of rays to a position withdrawn from the path of rays from the condenser lens system 2. The stop 3 will mask out a portion of the rays as the annular window allows a bundle of parallel rays having a circular or annular cross section to pass.

This special execution example is concerned with the case of a long focal distance magnetic lens 4 shows a lens with several separable excitable windings 5 with an iron sheath 6 surrounding these windings as an exterior sheath and at the end faces. In the posterior focal plane of the lens there is located a pinhole diaphragm 7, which s also mounted by means which enable it to be pivoted in the path of the rays and allow displacement of the pinhole diaphragm 7 along the optical axis of the microprojector. Underneath the pinhole diaphragm 7, a recording unit, illustrated as a photographic plate 8, is provided. It is noted that the device for determining the focal length or plane of the lens 4 comprises the annular field stop 3, the diaphragm 7 and the recording unit such as the plate 8.

For imaging of the transmission mask upon a wafer, neither of which are illustrated, the annular field stop 3 as well as the pinhole diaphragm 7 are removed from the path of the rays. Because of the high requirement for accuracy of the reduced image which is being focused by the long focal length lens 4, it is necessary to control the focal length of this lens as to distance. It may at least be necessary that the focal length determination be undertaken after each new engagement of the microprojector.

The principles of the invention in the process will be discussed with relation to FIG. 4 which shows in a simplified manner the path of the rays of the microprojector during determination of the focal length. Instead of the condenser lens system utilizing three stages as illustrated in FIG. 3, a single lens is schematically illustrated in FIG. 4 for the system 2. The same parts of FIG. 3 which are schematically illustrated will be provided with the same element numbers in FIG. 4.

The condenser 2 generates a bundle of paraxial rays from the divergent bundle of rays coming from the source 1. A bundle of rays with ring-shaped cross section is produced by the annular field stop 3. This annular bundle of parallel rays will have a radius R, which will amount to several centimeters. It should be noted that radius is the average radius of the annular bundle and that the width of the ring is sufficiently small as compared to the radius so that it can be disregarded with regard to the calculations.

Only the geometric center of the long focal length lens 4, which lens has the focal length which is to be determined, is known; however, the principle plane from which the focal length has to be calculated is not known. Near the mechanical center of the lens possible principle planes 9 and 10 are indicated in broken lines in the figure. The electron rays which are refracted by the lens intersect the optical axis in a posterior focal plane and an image of the source will occur. The location of the focal plane is to be determined with the help of a pinhole diaphragm 7. With what degree of accuracy this is possible has already been explained with regard to FIG. 2. Underneath the pinhole diaphragm 7, a recording unit which is illustrated as a ring-shaped detector unit 8 in FIG. 4 is located and a recording of the bundle of rays can be measured on the recording unit. If the location of the posterior focal plane is determined by the pinhole diaphragms 7, then the distance $z_2$ between this diaphragm and the detector unit $8'$ is also given. Thus, all magnitudes for the determination of the focal length are present. The distance $z_1$ between the pinhole diaphragm 7 and the mechanical center of the lens 4 is then also known and the principle plane distance h is produced according to $h = f - z_1$.

With an example, the advantages of introducing the annular field stop 3 for increasing the accuracy in the determination of the focal length is demonstrated. In the example, the aperture aberration of the lenses $C_s = 2.33 \cdot 10^3$ mm which value is calculated theoretically from the lens data, the angle $\beta = 6.6 \cdot 10^{-2}$ rad. and the angle $\alpha = 5.3 \cdot 10^{-4}$ rad. From the above information, one can calculate the circle of least confusion in the posterior focal plane for the case in which the entire cross section of the lens 4 is used to its fullest, that is, without the annular field stop 3. From these calculations result in a diameter of $2\delta$ for the circle of least confusion being $2\delta = 2 \cdot C_s \cdot \beta^3 = 1.34$ mm. If, however, the ring stop 3 is inserted in the path of rays, then the circle of least confusion will be $2\delta' = 6 \cdot C_s \cdot \beta^2 \cdot \alpha = 33$ μm. By introducing the annular field stop 3, the circle of least confusion is drastically reduced. As a result of this, the determination of the focal length is possible with a higher precision since the diameter of the pinhole of the diaphragm can be reduced accordingly. As explained earlier, the diameter of the pinhole of the diaphragm must be at least as large as the diameter of the circle of least confusion in order to transmit the entire intensity through the diaphragm. On the other hand, for accuracy determinations of the location of the posterior focal plane, the diameter should be as small as possible. In the case of known magnitudes of the circle of least confusion, which magnitude can be calculated as has been shown, one makes from this requirement the diameter of the pinhole of the diaphragm 7 approaching or equal to the magnitude of the circle of least confusion. For the uncertainty of the distance $z_2$, which was given by $$\Delta z_2 = \frac{1}{\beta} \rho,$$

one can then write in approximating manner $$\Delta z_2 \approx \frac{1}{\beta} \delta'.$$

one further assumes that the radius r of the bundle of rays in the recording plane amounts to 10 mm and can be measured precisely at 20 μm, then the result for the relative focal length accuracy will be determined by the following relationship:

$$\frac{\Delta f}{f} \approx \frac{3C_s \cdot \beta\alpha}{z_2} + \frac{\Delta r}{r} \approx 3 \cdot 10^{-3}.$$

In this manner, the focal lengths of the long focal length electron optical lenses can be determined exactly to a thousandth. With the use of these examples, once more it should become clear that in contrast to the representation in the figures, the angles occurring are so small, that in a good approximation within the derivation of the formulas used, in each case, the tangent could be replaced by its angle.

Although various minor modifications may be suggested by those versed in the art, it should be understood that we wish to embody within the scope of the patent granted hereon, all such modifications as reasonably and properly come within the scope of our contribution to the art.

We claim:

1. A method for determining the focal length of long focal length lenses comprising the steps of projecting a bundle of parallel rays on the long focal length lenses, said bundle of parallel rays having a ring-shaped cross section with a radius R; providing a pinhole diaphragm having a diameter which corresponds approximately to the diameter of the circle of least confusion of the lenses for the ring-shaped bundle of parallel rays in an approximate position of the focal plane; changing the axial distance of the diaphragm relative to the focal point of the lens to obtain the least influence by the diaphragm on the bundle of rays passing therethrough; detecting the image of the rays passing through the diaphragm on a plane at a distance $z_2$ from the diaphragm; measuring the radius r of the image of the ring-shaped bundle of rays on the plane, and then determining the focal length f from the magnitude of R, r, $z_2$ according to a formula $f=(R/r) \cdot z_2$.

2. A method according to claim 1, which includes the step of forming the bundle of parallel rays having a ring-shaped cross section by positioning an annular field stop having an annular window in the path of a bundle of parallel rays projected from a condenser lens toward the long focal length lenses.

3. A method according to claim 1, wherein the step of changing the axial distance comprises holding the diaphragm in a fixed position and varying the excitement of the long focal length lens.

4. A method according to claim 1, wherein the step of changing the axial distance comprises moving the diaphragm along the axis of the long focal length lens.

5. A device for determining the focal length of a long focal length lens of a microprojector, said microprojector having an electron ray source positioned at a focal point for a condenser lens system, said condenser lens system providing a bundle of parallel rays for the long focal length lenses so that rays from the source pass through the condenser lens system then through the long focal length lenses for projection on a surface of an object, said device for determining comprises providing an annular field stop; first means for pivotably mounting the annular field stop between the condenser lens system and the long focal length lenses, said means enabling pivoting the field stop from a first position in the path of the rays from the condenser lens to a second position removed from said path; providing a pinhole diaphragm having an aperture with a diameter corresponding to the approximate diameter of the circle of least confusion of the long focal length lenses for a ring-shape bundle of rays having a radius R; second means for pivotably mounting the pinhole diaphragm for pivotable movement into and out of the path of rays from the long focal length lenses and recording means for recording the intensity of the bundle of rays passing through the pinhole diaphragm.

6. A device according to claim 5, wherein the recording means comprises a photographic plate.

7. A device according to claim 5, wherein the means for recording comprises a ring-shaped detector with a radius r, and means for mounting the ring-shaped detector for displacement along the optical axis of the long focal length lenses.

8. A device according to claim 5, wherein the second means for pivotably mounting the pinhole diaphragm includes means for displacing of the diaphragm along the optical axis of the long focal length lenses.

9. A device according to claim 8, wherein the recording means comprises a photographic plate.

10. A device according to claim 8, wherein the recording means includes a ring-shaped detector with a radius r, and means for mounting the ring-shaped detector for displacement along the optical axis of the device.

* * * * *